United States Patent
Tomizawa (10) Patent No.: US 7,309,562 B2
(45) Date of Patent: Dec. 18, 2007

(54) MICROLENS MANUFACTURING METHOD AND SOLID-STATE IMAGE PICK-UP UNIT MANUFACTURING METHOD

(75) Inventor: Hiroshi Tomizawa, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 106 days.

(21) Appl. No.: 11/359,474

(22) Filed: Feb. 23, 2006

(65) Prior Publication Data
US 2006/0194153 A1    Aug. 31, 2006

(30) Foreign Application Priority Data
Feb. 28, 2005 (JP) .......................... P2005-052777

(51) Int. Cl.
*H01L 27/14* (2006.01)
(52) U.S. Cl. ...................... 430/321; 430/319; 430/328; 430/330
(58) Field of Classification Search ...................... None
See application file for complete search history.

(56) References Cited

U.S. PATENT DOCUMENTS 6,127,668 A * 10/2000 Baek ........................ 250/208.1

FOREIGN PATENT DOCUMENTS

| JP | 4-184970 A | * | 7/1992 |
| JP | 10-148704 A |  | 6/1998 |
| JP | 2005-101452 A | * | 4/2005 |

* cited by examiner

*Primary Examiner*—John A. McPherson
(74) *Attorney, Agent, or Firm*—Birch, Stewart, Kolasch & Birch, LLP (57) ABSTRACT

A method of manufacturing a microlens comprising the steps of: (a) applying a resist for an excimer laser, an ultraviolet exposure or an electron beam onto a surface, and carrying out an exposure with a light in an ultraviolet region or an electron beam and a development, so as to form a patterned resist; (b) heat treating the resist patterned at the step (a) to give a shape of a microlens; and (c) implanting an ion in a plurality of directions into at least a surface portion of the resist to which the shape of the microlens is given at the step (b), to obtain a microlens having a heat resistance.

19 Claims, 6 Drawing Sheets

MICROLENS MANUFACTURING METHOD AND SOLID-STATE IMAGE PICK-UP UNIT MANUFACTURING METHOD

BACKGROUND OF THE INVENTION

1. Field of the Invention

The present invention relates to a method of manufacturing a microlens. Moreover, the invention relates to a method of manufacturing a solid-state image pick-up unit comprising the microlens.

2. Description of the Related Art

Figure 7A:
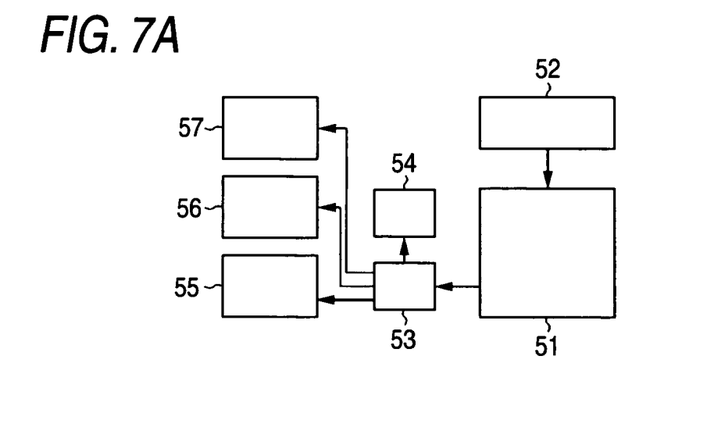
FIG. 7A is a block diagram showing a main part of a solid-state image pick-up device incorporating the solid-state image pick-up unit.
Figure 7B:
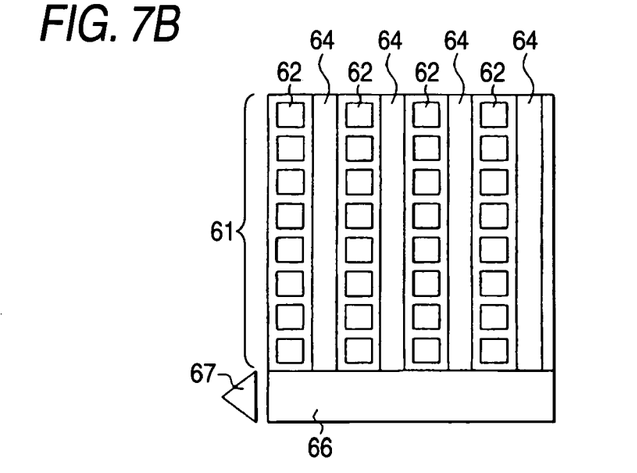
FIG. 7B is a schematic plan view showing a structure of the solid-state image pick-up unit.
Figure 7C:
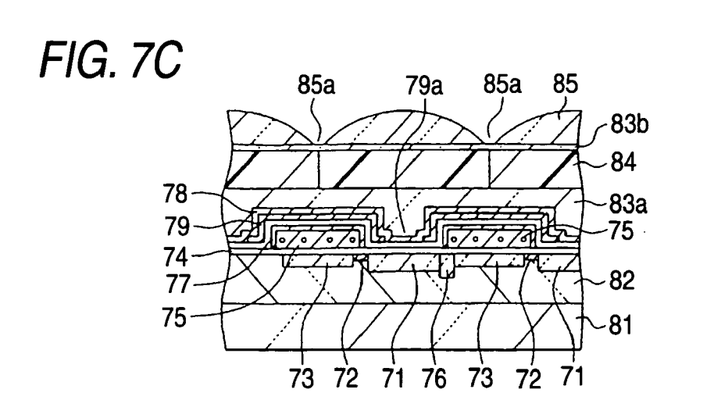
FIG. 7C is a schematic sectional view showing a part of a pixel array portion of the solid-state image pick-up unit comprising the microlens.

FIG. 7A is a block diagram showing a main part of a solid-state image pick-up device incorporating a solid-state image pick-up unit and FIG. 7B is a schematic plan view showing a structure of the solid-state image pick-up unit. Moreover, FIG. 7C is a schematic sectional view showing a part of a pixel array portion of the solid-state image pick-up unit comprising a microlens.

Reference will be made to FIG. 7A. The solid-state image pick-up device comprises a solid-state image pick-up unit 51 for generating a signal charge corresponding to an amount of a light incident for each pixel and supplying an image signal based on the signal charge thus generated, a driving signal generating device 52 for generating a driving signal (a transfer voltage) to drive the solid-state image pick-up unit 51 and supplying the driving signal to the solid-state image pick-up unit 51, an output signal processing device 53 for carrying out a processing such as a reduction in a noise, a white balance or a data compression over the image signal supplied from the solid-state image pick-up unit 51, a storage device 54 such as a storage card connected to the output signal processing device 53 and serving to store the image signal, a display device 55 such as a liquid crystal display device for displaying the image signal, a transmitting device 56 to be an interface for transmitting the image signal to an outside, and a television 57 for displaying the image signal if necessary.

The solid-state image pick-up unit roughly includes a CCD type and an MOS type. The CCD type transfers an electric charge generated in a pixel through a CCD. The MOS type amplifies and outputs the electric charge generated in the pixel by an MOS transistor. Description will be given by taking the CCD type as an example, which is not particularly restricted.

A signal supplied from the driving signal generating device 52 to the solid-state image pick-up unit 51 includes a horizontal CCD driving signal, a vertical CCD driving signal, an output amplifier driving signal and a substrate bias signal.

Reference will be made to FIG. 7B. For example, the solid-state image pick-up unit is constituted to include a plurality of photosensitive portions 62 disposed in a matrix, a plurality of vertical CCD portions 64, a horizontal CCD portion 66 coupled electrically to the vertical CCD portions 64, and an amplifying circuit portion 67 provided on an end of the horizontal CCD portion 66 and serving to amplify an output charge signal from the horizontal CCD portion 66. A pixel array portion 61 is constituted to include the photosensitive portion 62 and the vertical CCD portion 64.

The photosensitive portion 62 is constituted to include a photoelectric converting unit (photodiode) and a reading gate. The photoelectric converting unit generates and stores a signal charge corresponding to an amount of an incident light. The signal charge thus stored is read from the reading gate onto the vertical CCD portion 64 and is transferred in the vertical CCD portion 64 (the vertical transfer channel) toward the horizontal CCD portion 66 (in a vertical direction). The signal charge transferred to a terminal of the vertical CCD portion 64 is transferred in the horizontal CCD portion 66 (a horizontal transfer channel) in a horizontal direction, and is amplified in the amplifying circuit portion 67 and is taken out.

Reference will be made to FIG. 7C. For example, a p-type well layer 82 formed on a semiconductor substrate 81 to be an n-type silicon substrate is provided with a photoelectric converting unit 71 constituted by an n-type impurity addition region and a vertical transfer channel 73 to be an n-type region which is adjacent thereto through a p-type reading gate 72. A vertical transfer electrode 75 is formed above the vertical transfer channel 73 through an insulating film 74. A p-type channel stop region 76 is formed between the adjacent photoelectric converting units 71.

The channel stop region 76 serves to carry out an electrical isolation of the photoelectric converting unit 71 and the vertical transfer channel 73. The insulating film 74 is an ONO film obtained by laminating, on a surface of the semiconductor substrate 81, a silicon oxide film formed by a thermal oxidation, a silicon nitride film formed by CVD, for example, and a silicon oxide film obtained by the thermal oxidation of a surface of the silicon nitride film, for example, in this order from below. The vertical transfer electrode 75 includes a first layer vertical transfer electrode and a second layer vertical transfer electrode which are formed by polysilicon, for example. An insulating silicon oxide film 77 obtained by the thermal oxidation of polysilicon is formed on the vertical transfer electrode 75, for example. The vertical CCD portion 64 is constituted to include the vertical transfer channel 73, and the insulating film 74 and the vertical transfer electrode 75 which are formed thereon.

A light shielding film 79 is formed of tungsten, for example, through the insulating silicon oxide film 77 above the vertical transfer electrode 75. The light shielding film 79 has an opening portion 79a formed above the photoelectric converting unit 71. A silicon nitride film 78 is formed on the light shielding film 79.

A signal charge generated in the photoelectric converting unit 71 corresponding to an amount of an incident light is transferred into the vertical transfer channel 73 through a driving signal (a transfer voltage) read from the reading gate 72 to the vertical transfer channel 73 and applied to the vertical transfer electrode 75. The light shielding film 79 has the opening portion 79a above each photoelectric converting unit 71 as described above and prevents a light incident on the pixel array portion 61 from being incident on a region other than the photoelectric converting unit 71.

A flattened layer 83a formed of silicon oxide is provided above the light shielding film 79, for example, and a color filter layer 84 for three primary colors of red (R), green (G) and blue (B) is formed on the flat surface, for example. In order to flatten a portion provided thereon, furthermore, a flattened layer 83b is formed. A microlens 85 formed of a photoresist for a microlens is provided on the flattened layer 83b having a flattened surface, for example. In the microlens 85, a very small hemispherical convex lens is arranged above each photoelectric converting unit 71, for example. The microlens 85 collects the incident light into the photoelectric converting unit 71. The light to be collected by the microlens 85 is incident on the photoelectric converting unit 71 through the color filter layer 84. A reactive space 85a is formed between the adjacent microlenses 85.

In order to manufacture the microlens 85, some methods have been known. There has been a method of patterning a photoresist for a microlens having both a photosensitivity to an i-line and a thermosetting property to take a planar shape of the lens and then carrying out a heat treatment to cause a surface to be a spherical surface, thereby obtaining the shape of the lens.

Moreover, there has also been proposed a technique for applying a photoresist for a microlens onto a transparent lens material member and carrying out patterning to form an original shape of the lens, and then transferring a shape onto the lens material member through dry etching (for example, see JP-A-10-148704).

On the other hand, a reduction in the reactive space 85$a$ of the microlens 85 has been required with the microfabrication of a pixel in an image pick-up device. However, a photoresist for a microlens which is currently put on the market is used exclusively for the i-line and has a low resolution. For this reason, it is hard to sufficiently reduce the reactive space 85$a$.

With the microfabrication of a pixel, moreover, the use of a KrF exposing device in a wafer process has been a mainstream and the opening portion 79$a$ of the light shielding film 79 is formed by using the KrF exposing device, for example. For this reason, in the case in which a special photoresist for the i-line and the i-line exposing device are used in order to form the microlens 85, it is hard to obtain high precision in an alignment between an opening pattern of the opening portion 79$a$ of the light shielding film 79 and the microlens 85 by the influence of a peculiar distortion to the device and a magnification error.

SUMMARY OF THE INVENTION

It is an object of the invention to provide a method of manufacturing a microlens which can reduce a space between adjacent lenses to each other.

The invention provides a method of manufacturing a microlens comprising the steps of (a): applying a resist for an excimer laser, an ultraviolet exposure or an electron beam onto a surface and carrying out an exposure with a light in an ultraviolet region or an electron beam and a development, thereby forming a patterned resist; (b) heat treating the resist patterned at the step (a), to give a shape of a microlens; and (c) implanting an ion in a plurality of directions into at least a surface portion of the resist to which the shape of the microlens is given at the step (b), to obtain a microlens having a heat resistance.

According to the manufacturing method, it is possible to manufacture a microlens having a small space between adjacent lenses to each other.

In the method of manufacturing a microlens according to the invention, the ion implantation in the directions at the step (c) is carried out by a dividing implantation or a rotating implantation.

The method of manufacturing a microlens according to the invention further comprises the step (d) of heat treating the microlens or irradiating the microlens with the light in the ultraviolet region after the step (c).

In the method of manufacturing a microlens according to the invention, the resist for an excimer laser, the ultraviolet exposure or the electron beam is formed by a material selected from the group consisting of an acetal type, an SCAP type, polymethyl methacrylate (PMMA) and polyglycidyl methacrylate (PGMA).

In the method of manufacturing a microlens according to the invention, a plurality of unit resists are formed at the step (a) by carrying out patterning in such a manner that an interval between adjacent ones of said plurality of unit resists is equal to or smaller than 0.2 μm.

In the method of manufacturing a microlens according to the invention, a monovalent or polyvalent ion of B, P, Ar or As is implanted at the step (c).

In the method of manufacturing a microlens according to the invention, an ion is implanted at an acceleration energy of 40 to 200 keV at the step (c).

In the method of manufacturing a microlens according to the invention, an ion is implanted in a dose amount of $1 \times 10^{12}$ to $1 \times 10^{14}$ cm$^{-2}$ at the step (c).

In the method of manufacturing a microlens according to the invention, an ion is implanted from a surface of the resist to a portion having a depth of 0.1 μm or more at the step (c).

The invention provides a method of manufacturing a solid-state image pick-up unit comprising the steps of (e) adding an impurity to a semiconductor substrate, so as to form a photoelectric converting unit; (f) forming a light shielding film in a region including an upper part of the photoelectric converting unit; (g) applying a resist onto the light shielding film, and carrying out an exposure and a development to leave the resist in only a predetermined position, and forming an opening portion in an upper region of the photoelectric converting unit in the light shielding film by etching using the first resist as a mask; (h) forming a flat surface in a region including an upper part of the opening portion; and (i) forming a microlens on the flat surface provided above the opening portion, the step (i) including the steps of: (i-1) applying a resist for an excimer laser, an ultraviolet exposure or an electron beam onto the flat surface, and carrying out an exposure with a light in an ultraviolet region or an electron beam and a development, so as to form a patterned resist; (i-2) heat treating the patterned resist at the step (i-1), to give a shape of a microlens; and (i-3) implanting an ion in a plurality of directions into at least a surface portion of the resist to which the shape of the microlens is given at the step (i-2), to obtain a microlens having a heat resistance.

According to the manufacturing method, it is possible to reduce the size of the space to be formed between the lenses of the microlens. Consequently, it is possible to reduce the size of the solid-state image pick-up unit.

By using the same exposing device at the steps (g) and (i-1), moreover, it is possible to maintain high precision in an alignment between the opening portion of the light shielding film and the microlens. Thus, it is possible to manufacture a solid-state image pick-up unit having an excellent optical characteristic.

In the method of manufacturing a solid-state image pick-up unit according to the invention, the ion implantation in the directions at the step (i-3) is carried out by a dividing implantation or a rotating implantation.

In the method of manufacturing a solid-state image pick-up unit according to the invention, the exposure at the step (g) and the exposure at the step (i-1) are carried out by using an exposing device utilizing the same type of light source.

The method of manufacturing a solid-state image pick-up unit according to the invention further comprises the step (i-4) of heat treating the microlens or irradiating the microlens with the light in the ultraviolet region after the step (i-3).

In the method of manufacturing a solid-state image pick-up unit according to the invention, the resist for the excimer laser, the ultraviolet exposure or the electron beam is formed by a material selected from the group consisting of an acetal type, an SCAP type, polymethyl methacrylate (PMMA) and polyglycidyl methacrylate (PGMA).

In the method of manufacturing a solid-state image pick-up unit according to the invention, a plurality of unit resists are formed at the step (i-1) by carrying out patterning in such a manner that an interval between adjacent ones of said plurality of unit resists is equal to or smaller than 0.2 μm.

In the method of manufacturing a solid-state image pick-up unit according to the invention, a monovalent or polyvalent ion of B, P, Ar or As is implanted at the step (i-3).

In the method of manufacturing a solid-state image pick-up unit according to the invention, an ion is implanted at an acceleration energy of 40 to 200 keV at the step (i-3).

In the method of manufacturing a solid-state image pick-up unit according to the invention, an ion is implanted in a dose amount of $1 \times 10^{12}$ to $1 \times 10^{14}$ cm$^{-2}$ at the step (i-3).

In the method of manufacturing a solid-state image pick-up unit according to the invention, an ion is implanted from a surface of the resist to a portion having a depth of 0.1 μm or more at the step (i-3)

DETAILED DESCRIPTION OF THE INVENTION

Although a resist for an excimer laser or an ultraviolet exposure, for example, a general purpose resist such as a KrF resist can be utilized as a lens material having a high resolution, a sufficient heat resistance cannot be obtained. For this reason, in some cases in which the resist is exposed to a high temperature (approximately 220° C. in soldering) in the soldering of a solid-state image pick-up unit chip at an assembling step to be carried out after the formation of a lens, for example, a packaging step, a thermal flow is generated to cause a deformation. The inventors successfully fabricated a microlens having a heat resistance by using a resist for an excimer laser or an ultraviolet exposure such as KrF or ArF having no absorption of a visible light in the general purpose resist having no curing property at a heat treating temperature at which the lens is formed.

By taking a method of manufacturing a solid-state image pick-up unit as an example, description will be given to a method of manufacturing a microlens.

FIGS. 1A to 1D are schematic sectional views for explaining a method of manufacturing a solid-state image pick-up unit comprising a microlens.

Figure 1A:
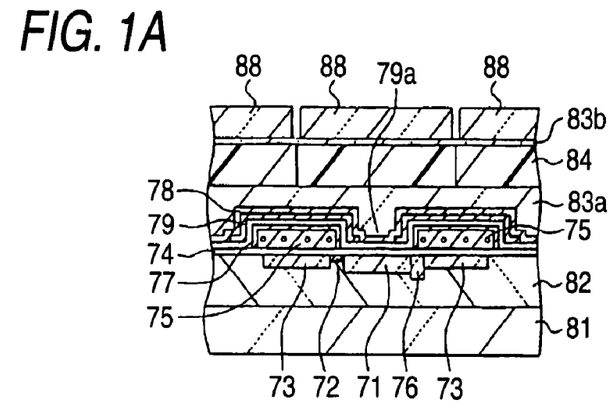
FIGS. 1A to 1D are schematic sectional views for explaining a method of manufacturing a solid-state image pick-up unit comprising a microlens.

Reference will be made to FIG. 1A. For example, a semiconductor substrate 81 to be an n-type silicon substrate is prepared and a p-type impurity, for example, a boron ion is implanted from a surface thereof, thereby forming a P-type well layer 82.

An n-type impurity, for example, a phosphorus or arsenic ion is implanted into the vicinity of a surface of the well layer 82 to form a vertical transfer channel 73. Moreover, a p-type impurity, for example, a boron ion is implanted to form a channel stop region 76. A silicon oxide film by a thermal oxidation and a silicon nitride film by CVD are formed on the semiconductor substrate 81 and a surface thereof is thermally oxidized to form an ONO film. Thus, an insulating film 74 is formed.

A vertical transfer electrode 75 is formed of polysilicon in order to cover the vertical transfer channel 73, for example. The vertical transfer electrode 75 is constituted by transfer electrodes to be first and second layers, for example. The vertical transfer electrode 75 is fabricated by depositing polysilicon on the insulating film 74 by CVD, for example, and patterning the polysilicon through photolithography and etching.

The vertical transfer electrode 75 is used as a mask or a resist is applied onto the vertical transfer electrode 75 and the insulating film 74, and an exposure and a development are then carried out to leave the resist in only a predetermined position. By using the resist as a mask, an n-type impurity such as a phosphorus or arsenic ion or a p-type impurity such as a boron ion is implanted to form an impurity addition region such as a photoelectric converting unit 71 and a reading gate 72.

In addition, a horizontal CCD portion 66 and an amplifying circuit portion 67 are formed on the semiconductor substrate 81, which is not shown in the sectional view of FIG. 1A.

The vertical transfer electrode 75 is thermal oxidized to form a silicon oxide film 77 on a surface thereof, and a light shielding film 79 is then formed of tungsten thereabove, for example. A resist is applied onto the light shielding film 79 and an exposure and a development are then carried out to leave the resist in only a predetermined position. By carrying out etching using the resist as a mask, an opening portion 79a is formed above the photoelectric converting unit 71. For example, a KrF exposing device is used for a whole exposing work according to the example including the step of forming the opening portion 79a of the light shielding film 79.

A flattened layer 83a is formed in a region including an upper part of the light shielding film 79 by BPSG through vapor phase growth, for example. By carrying out a reflow over the deposited BPSG film at 850° C., for example, a flattened surface of the flattened layer 83a can be obtained. For the flattening, it is also possible to use chemical mechanical polishing (CMP), for example, in addition to the reflow. In addition to the BPSG, moreover, it is also possible to use another silicon oxide to which an impurity is added to drop a melting point.

A color filter layer 84 for three primary colors of red (R), green (G) and blue (B) is formed on the flat surface of the flattened layer 83a, for example. The color filter layer 84 is formed by applying a solution prepared through a mixture of a granular pigment into a photoresist solution (a pigment dispersing resist) onto the surface of the flattened layer 83a, forming a pattern by an exposure and a development and carrying out thermal curing at a curing temperature of 220° C., for example. Filter layers having three colors of red (R), green (G) and blue (B) are formed in order.

A flattened layer 83b is formed on the color filter layer 84. The reason is that the color filter layer 84 has a concavo-convex portion on a surface. The flattened layer 83b is formed by applying a transparent photoresist and thermally curing the photoresist at a curing temperature of 220° C., for example.

The above steps are the same as steps in a conventional method of manufacturing a solid-state image pick-up unit. Subsequently, a microlens 85 is formed on the flattened layer 83b.

A resist 88, for example, a KrF resist (GKR5315) manufactured by Fuji Film Electronics Materials Co., Ltd. is applied onto a surface of the flattened layer 83b. The resist is a positive photoresist fabricated for an excimer laser.

Next, a light in an ultraviolet region is irradiated (reduction exposed) by using the KrF exposing device and the development is carried out to form a microlens pattern. For example, a microlens pattern having a plurality of rectangular unit resists disposed in a matrix is formed. For instance, a microlens pattern is formed in such a manner that one unit resist 88 takes a square shape having one side of 2.5 to 2.6 μm and an interval between the adjacent unit resists 88 taking the square shape is equal to or smaller than 0.2 μm.

Figure 1B:
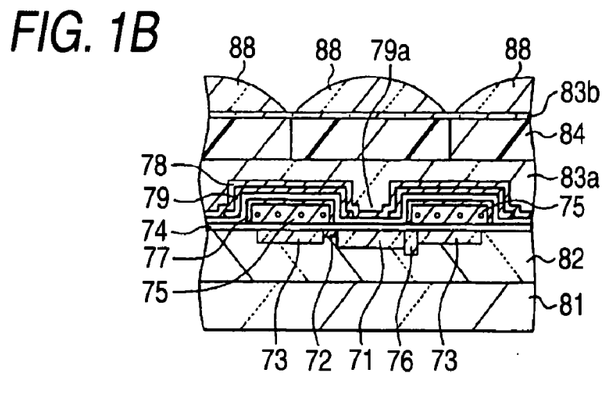

Reference will be made to FIG. 1B. The unit resist 88 patterned to take the square is heat treated at 120 to 140° C. to take a suitable spherical shape for the microlens, for example.

Figure 1C:
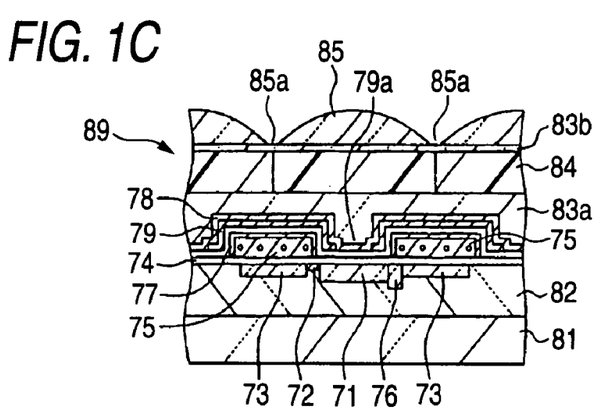

Reference will be made to FIG. 1C. An ion is implanted into the unit resist 88 to take a suitable lens shape. For example, a $P^+$ ion is implanted at an acceleration energy of 80 keV in a dose amount of $1.0 \times 10^{13}$ cm$^{-2}$. By implanting the ion, the unit resist 88 taking the shape of the lens is cured from a surface to a portion having a certain depth so that the microlens 85 is formed. The curing depth mainly depends on the acceleration energy in the implantation of the ion. It is desirable that the curing depth should be equal to or greater than 0.1 μm. A reactive space 85a between the adjacent microlenses 85 is formed to be equal to or smaller than 0.2 μm, for example.

In order to inactivate a photosensitive radical in the microlens 85 to enhance a stability of the lens after the implantation of the ion, it is preferable to carry out a heat treatment at a temperature of 200° C. or more or to irradiate ultraviolet rays. Thus, a solid-state image pick-up unit 89 is obtained.

A specific method of implanting an ion into the unit resist 88 will be described below in detail.

Figure 2:
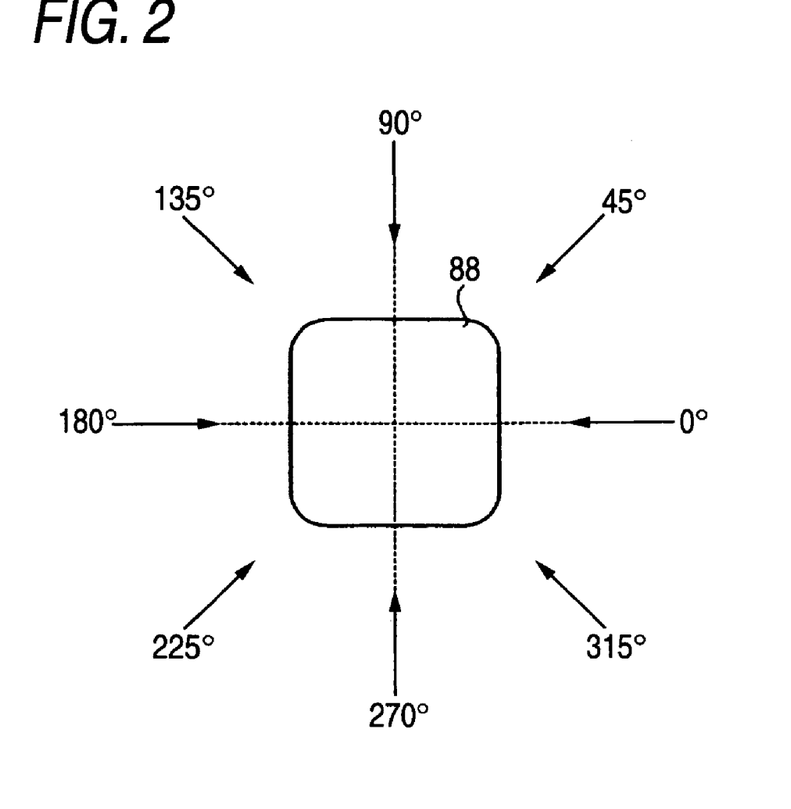
FIG. 2 is a view for explaining a twist angle set in an ion implantation.
Figure 3:
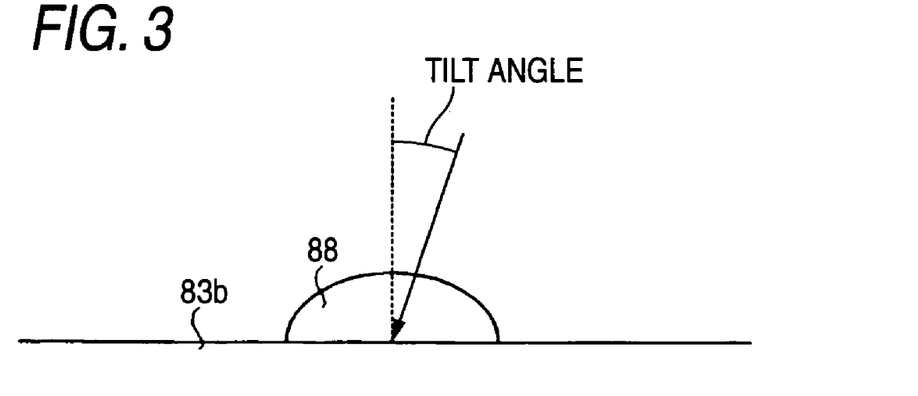
FIG. 3 is a view for explaining a tilt angle set in the ion implantation.

The implantation of the ion into the unit resist 88 is carried out by determining a twist angle indicative of a direction of the ion implantation and a tilt angle indicative of an angle of the ion implantation. The twist angle is a direction in which a center of the unit resist 88 is set to be a reference when the unit resist 88 is seen from above as shown in FIG. 2, for example, and is indicated by an angle which is increased counterclockwise from a reference (a twist angle of 0 degree) to be a rightward direction of the center of the unit resist 88, for example. For instance, it is suggested that the ion is implanted in the rightward direction from the center of the unit resist 88 shown in FIG. 2 if the twist angle is 0 degree, and the ion is implanted in a rightward, oblique and downward direction from the center of the unit resist 88 shown in FIG. 2 if the twist angle is 45 degree. The tilt angle is an angle formed with respect to a perpendicular line to a surface on which the unit resist 88 is provided as shown in FIG. 3. By the determination of the twist angle and the tilt angle, a direction and an angle for the ion implantation are determined with respect to the unit resist 88.

Figure 4:
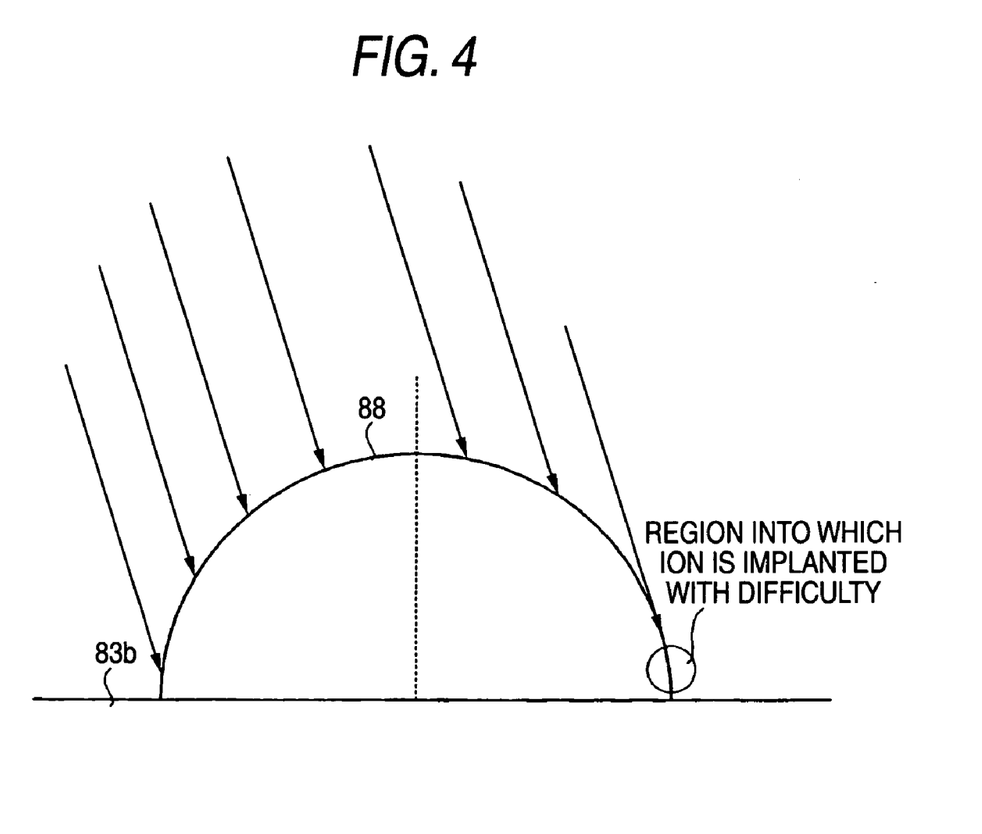
FIG. 4 is a view showing a state in which the ion implantation is carried out in one direction.

For example, there will be considered the case in which the ion is implanted into the resist material 88 at a twist angle of 180 degrees and a tilt angle of 14 degrees. In this case, the ion is implanted as shown in FIG. 4 as seen from a section of the unit resist 88. When a height of the resist material 88 from the flattened layer 83b is greater, there is a possibility that a shade might be formed due to the height, a rate of a region in which the ion is implanted with difficulty (a region surrounded by a circle in FIG. 4) might be increased more greatly, and the ion might not be implanted uniformly.

In the embodiment, therefore, a dividing implantation capable of implanting an ion in a plurality of directions is utilized for the implantation of the ion into the unit resist 88. For example, the tilt angle is fixed to be 14 degrees and the twist angle is switched into eight angles of 0 degree, 45 degrees, 90 degrees, 130 degrees, 180 degrees, 225 degrees, 270 degrees and 315 degrees respectively, thereby carrying out an eight-dividing implantation and implanting an ion in the eight directions. By the execution of the eight-dividing implantation, even if the region is generated through the implantation of the ion in a certain direction (for example, a twist angle of 180 degrees), the ion can also be implanted into the region by the ion implantation in a reverse direction to the direction (a twist angle of 0 degree). Even if the height of the resist material 88 is increased, therefore, the ion can be uniformly implanted into the whole resist material 88. Conventionally, a resist material has been heat treated and cured. For this reason, it is hard to reduce the reactive space between the microlenses due to the fusion of the adjacent microlenses. According to the method in accordance with the embodiment, however, it is possible to uniformly cure the resist material by the ion implantation, thereby forming the microlens. Consequently, the reactive space can easily be reduced.

The twist angle can be switched in the dividing implantation by fixing a position of an ion implanting device and moving a platen for mounting the semiconductor substrate 81 thereon with respect to the ion implanting device.

Moreover, a rotating implantation may be utilized as a method of implanting an ion in a plurality of directions. Also in the case in which the tilt angle is fixed to be 14 degrees and the ion is implanted while the platen for mounting the semiconductor substrate 81 thereon is rotated at a certain speed, for example, the ion can be implanted uniformly into the whole resist material 88 in the same manner as described above.

According to the manufacturing method described above, it is possible to fabricate the microlens 85 by setting the reactive space 85a to be equal to or smaller than 0.2 μm. Consequently, it is possible to reduce a size of a device comprising a microlens, for example, a solid-state image pick-up unit.

Moreover, it is possible to form the microlens 85 by the same exposing device as the exposing device (for example, a KrF stepper) for forming the opening portion 79a of the light shielding film 79. Therefore, it is possible to relieve the influence of a lens distortion which is peculiar to the exposing device, thereby obtaining high precision in an alignment between both of them. Consequently, it is possible to manufacture a solid-state image pick-up unit having an excellent optical characteristic.

Figure 1D:
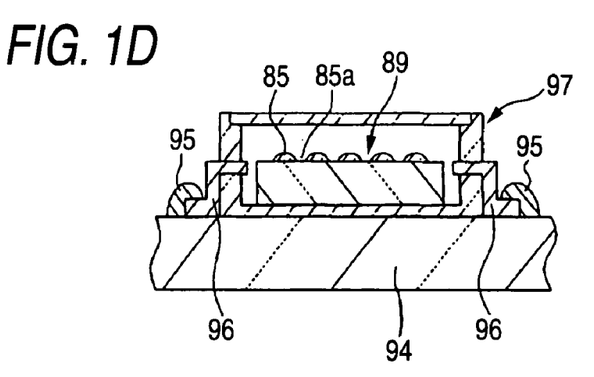

FIG. 1D is a schematic sectional view showing one scene of a step of mounting the solid-state image pick-up unit 89.

A lead 96 and a bonding pad of the solid-state image pick-up unit 89 are wire bonded in a package 97 of the solid-state image pick-up unit 89 which is packaged. The package 97 is disposed in a predetermined position on a printed circuit board 94 in which a predetermined metal wiring is provided. The lead 96 extended to the outside of the package 97 is connected to a predetermined wiring portion of the printed circuit board 94. The solid-state image pick-up unit 89 and the printed circuit board 94 are connected electrically to each other. A temperature in soldering is 220° C., for example.

The inventors fabricated the microlens 85 by utilizing the dividing implantation or the rotating implantation in a resist for an excimer laser or an ultraviolet exposure to implant an ion and to uniformly carry out curing from a surface to a portion having a certain depth. They confirmed that the microlens 85 thus fabricated has a heat resistance which is required for a subsequent step such as packaging.

FIGS. 5A to 5F are micrographs showing results of experiments carried out by the inventors.

Figure 5A:
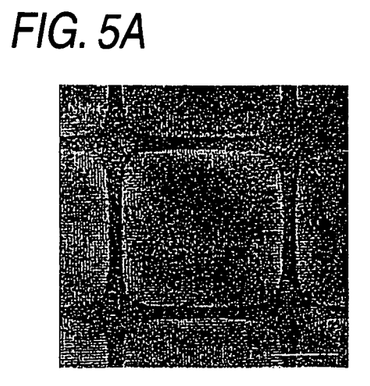
FIGS. 5A to 5F are micrographs showing results of experiments carried out by the inventors.

Reference will be made to FIG. 5A. The inventors first applied a KrF resist (GKR5315) manufactured by Fuji Film Electronics Materials Co., Ltd. in a thickness of 0.5 µm onto a surface of a flattened layer provided on a color filter layer, carried out a reduction exposure by using a KrF exposing device and executed a development to form a unit resist taking a square shape having one side of 2.69 µm in a matrix (patterning). An interval between the unit resists taking the square shape which are adjacent to each other was set to be 0.2 µm.

Subsequently, the patterned KrF resist was heat treated at 130 to 135° C. and the KrF resist patterned to take the square shape was formed to take a lens shape. FIG. 5A shows a micrograph for the KrF resist patterned and formed to take the lens shape.

Figure 5B:
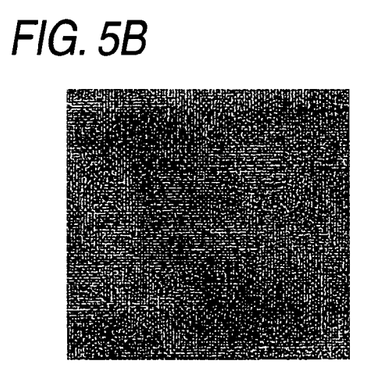

Reference will be made to FIG. 5B. The inventors heated the KrF resist shown in FIG. 5A to be 220° C. as a comparative example. At the temperature of 220° C., the solid-state image pick-up unit chip is soldered as described above. FIG. 5B shows a micrograph obtained after the heating.

It is apparent that the microlens pattern disappears by the heating and the microlens is not formed.

Figure 5C:
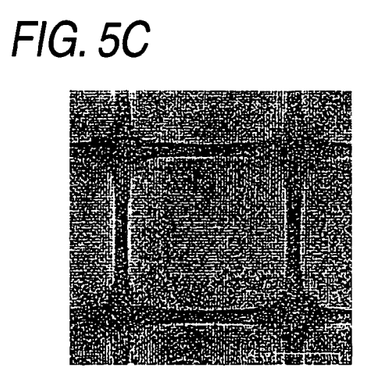

FIG. 5C shows a micrograph obtained after a $P^+$ ion is implanted at an acceleration energy of 80 keV in a dose amount of $1.00 \times 10^{13}$ cm$^{-2}$ into the KrF resist illustrated in FIG. 5A (the eight-dividing implantation illustrated above), thereby forming a microlens and carrying out heating to 220° C.

By the ion implantation, a portion from a surface of the KrF resist formed to take the lens shape to have a certain depth is wholly cured uniformly so that the microlens is formed. It is apparent that the microlens is also maintained to be excellent after the heating to 220° C.

Figure 5D:
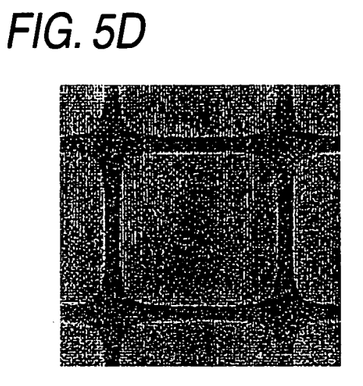

FIG. 5D is a micrograph showing the microlens subjected to the ion implantation and the heating in a dose amount of $1.00 \times 10^{14}$ cm$^{-2}$ on the same conditions as those in FIG. 5C. After the heating, similarly, the microlens is maintained to be excellent.

Figure 5E:
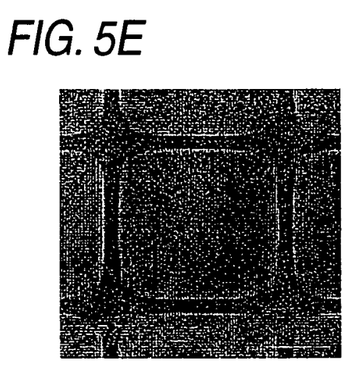

FIG. 5E is a micrograph showing the microlens subjected to the ion implantation and the heating by implanting an ion of $Ar^+$ on the same conditions as those in FIG. 5C. After the heating, similarly, the microlens is maintained to be excellent.

Figure 5F:
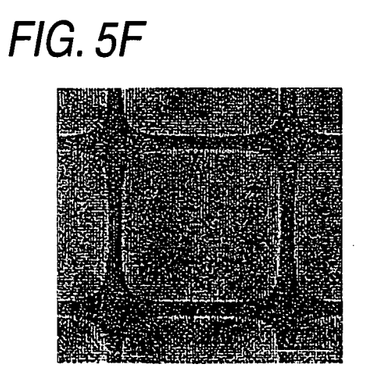

FIG. 5F is a micrograph showing the microlens subjected to the ion implantation and the heating by implanting the ion of $Ar^+$ on the same conditions as those in FIG. 5D. After the heating, similarly, the microlens is maintained to be excellent.

As is apparent from the photographs shown in FIGS. 5C to 5F, the microlens obtained by the manufacturing method described with reference to FIG. 1 has a heat resistance which is required for a subsequent step such as packaging for the solid-state image pick-up unit.

Also in the case in which the ion to be implanted is either $P^+$ or $Ar^+$, a damage or coloring is generated over the microlens obtained after the heating at 220° C. when the dose amount reaches $1.00 \times 10^{15}$ cm$^{-2}$.

Moreover, it was confirmed that the heat resistance required for the subsequent step such as the packaging can also be obtained by the implantation of an ion to be used generally in a semiconductor, for example, $B^+$, $P^+$, $Ar^+$ and $As^+$.

While the KrF exposing device has been used to fabricate the microlens with the KrF resist in the example, it is also possible to use an exposing device for irradiating a light in an ultraviolet region, for example, an ArF exposing device using an ArF excimer laser beam, or an electron beam exposing device using an electron beam, thereby fabricating a microlens with a resist which is suitable for each of the devices. Examples of a resist which can be used include an ArF resist, a Deep-UV resist and an electron beam resist. Examples of a specific material include an acetal type, an SCAP type, PMMA and PGMA.

For the ion implantation, moreover, it is also possible to use a polyvalent ion such as $P^{++}$ or $P^{+++}$ in addition to a monovalent ion such as $P^+$ or $Ar^+$. Furthermore, it is also possible to use ion species other than $B^+$, $P^+$, $Ar^+$ and $As^+$. In the microlens is fabricated, the ions are neutralized electrically and remain as added atoms. It can be supposed that an added atom such as an inert gas rarely remains in the microlens.

It is desirable that the acceleration energy and the dose amount in the ion implantation should be changed depending on a thickness of the microlens and a heat resistance which is required. In order to fabricate a suitable microlens for the solid-state image pick-up unit, it is preferable that the acceleration energy should be set to be 40 to 200 keV and the dose amount should be set to be $1 \times 10^{12}$ to $1 \times 10^{14}$ cm$^{-2}$.

Moreover, it is desirable that the tilt angle and the twist angle in the ion implantation should be changed depending on the thickness of the microlens and the heat resistance which is required.

While the ion is implanted in the eight directions as described above, furthermore, it is possible to uniformly cure a unit resist by implanting an ion in at least two directions which are reverse to each other (for example, a twist angle of 0 degree and 180 degrees). For this reason, the number of the directions in which the ion is implanted is not restricted to eight.

Figure 6A:
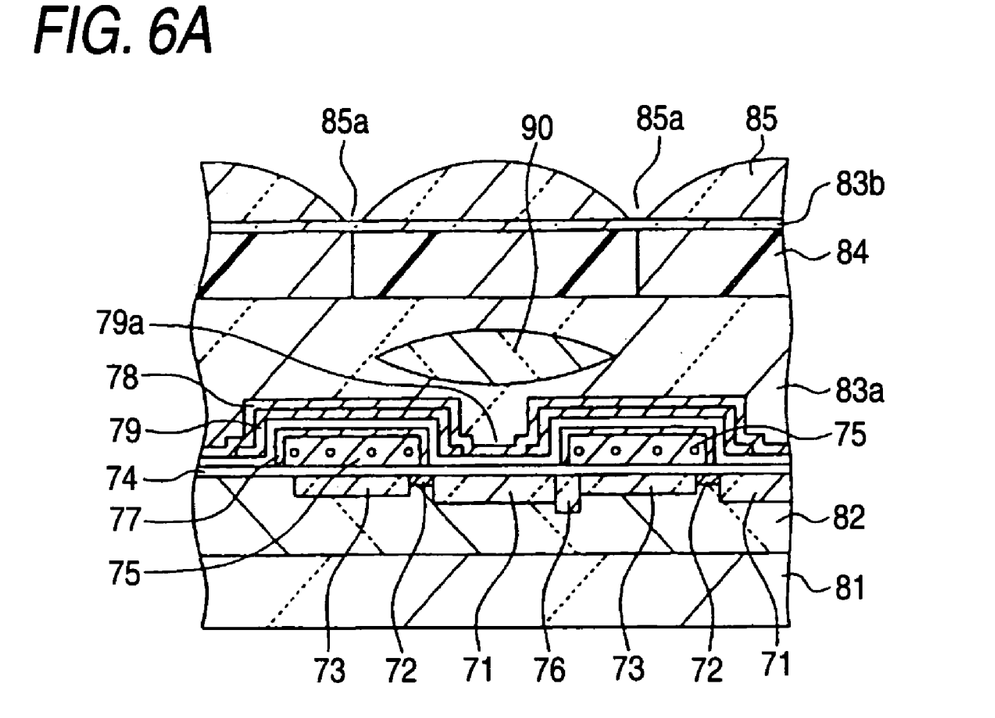
FIGS. 6A and 6B are views showing a variant of a solid-state image pick-up unit comprising a microlens manufactured by a manufacturing method according to an example.
Figure 6B:
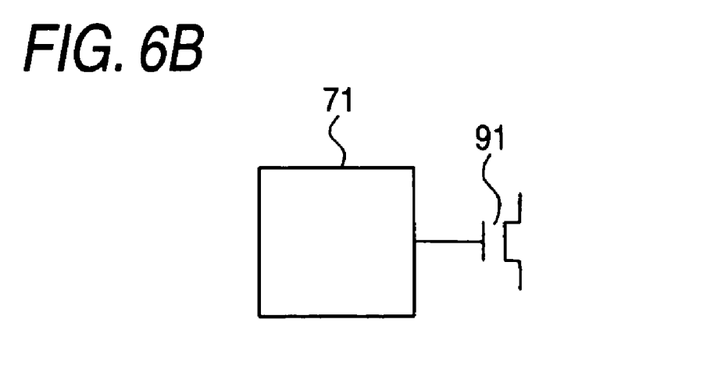

FIGS. 6A and 6B are views showing a variant of the solid-state image pick-up unit comprising the microlens manufactured by the manufacturing method according to the example.

Reference will be made to FIG. 6A. The solid-state image pick-up unit may have an inner lens 90 in a flattened layer 83a. The inner lens 90 is formed above each opening portion 79a of a light shielding film 79. By using a microlens 85 and the inner lens 90, an incident light is collected onto a photoelectric converting unit 71. Consequently, it is possible to enhance a light collecting efficiency.

The inner lens 90 is fabricated in the following manner, for example.

For example, a flattened layer 83*a* provided above the opening portion 79*a* of the light shielding film 79 is subjected to a reflow at 800° C., thereby adjusting a lower shape of the lens. A silicon nitride film is laminated thereon by vapor phase growth and an upper part of the opening portion 79*a* is embedded, and is then flattened slightly by etchback to form a lower inner lens taking a downward convex shape as a whole.

A silicon nitride film is laminated thickly on the lower inner lens by the vapor phase growth. A photoresist film is applied and formed on the laminated silicon nitride film, and a resist pattern is formed (exposed and developed) and a heat treatment is then carried out to form a photoresist film taking a lens shape.

Anisotropic etching is carried out by using the photoresist film taking the lens shape as a mask, thereby forming an upper inner lens taking an upward convex shape as a whole. The upper inner lens and the lower inner lens are combined to form an inner lens 90 taking a vertical convex shape as a whole.

Reference will be made to FIG. 6B. While the description has been given by taking the solid-state image pick-up unit of the CCD type as an example, the invention can also be applied to other solid-state image pick-up units. It is also possible to employ a solid-state image pick-up unit having such a structure that an MOS transistor 91 is connected to each photoelectric converting unit 71 and an electric charge stored in the photoelectric converting unit 71 can be selectively read out.

The solid-state image pick-up unit comprising the microlens manufactured by the manufacturing method according to the example may have a structure in which a photosensitive portion is arranged in a square matrix as shown in FIG. 7B or have a honeycomb structure.

While the invention has been described above by way of the examples, the invention is not restricted thereto. For example, it will be obvious to the skilled in the art that various changes, improvements and combinations can be made.

According to the invention, it is possible to provide a method of manufacturing a microlens which can reduce a space between adjacent lenses to each other. According to the invention, moreover, it is possible to provide a method of manufacturing a solid-state image pick-up unit which has a size reduced. According to the invention, furthermore, it is possible to provide a method of manufacturing a solid-stat image pick-up unit which is excellent in an optical characteristic.

The entire disclosure of each and every foreign patent application from which the benefit of foreign priority has been claimed in the present application is incorporated herein by reference, as if fully set forth.

What is claimed is:

1. A method of manufacturing a microlens comprising the steps of:
    (a) applying a resist for an excimer laser, an ultraviolet exposure or an electron beam onto a surface, and carrying out an exposure with a light in an ultraviolet region or an electron beam and a development, so as to form a patterned resist;
    (b) heat treating the resist patterned at the step (a) to give a shape of a microlens; and
    (c) implanting an ion in a plurality of directions into at least a surface portion of the resist to which the shape of the microlens is given at the step (b), to obtain a microlens having a heat resistance.

2. The method of manufacturing a microlens according to claim 1,
    wherein the ion implantation in the directions at the step (c) is carried out by a dividing implantation or a rotating implantation.

3. The method of manufacturing a microlens according to claim 1, further comprising
    the step (d) of heat treating the microlens or irradiating the microlens with the light in the ultraviolet region after the step (c).

4. The method of manufacturing a microlens according to claim 1,
    wherein the resist for the excimer laser, the ultraviolet exposure or the electron beam comprises a material selected from the group consisting of an acetal type, an SCAP type, polymethyl methacrylate (PMMA) and polyglycidyl methacrylate (PGMA).

5. The method of manufacturing a microlens according to claim 1,
    wherein a plurality of unit resists are formed at the step (a) by carrying out patterning in such a manner that an interval between adjacent ones of said plurality of unit resists is equal to or smaller than 0.2 μm.

6. The method of manufacturing a microlens according to claim 1,
    wherein a monovalent or polyvalent ion of B, P, Ar or As is implanted at the step (c).

7. The method of manufacturing a microlens according to claim 1,
    wherein an ion is implanted at an acceleration energy of 40 to 200 keV at the step (c).

8. The method of manufacturing a microlens according to claim 1,
    wherein an ion is implanted in a dose amount of $1\times10^{12}$ to $1\times10^{14}$ cm$^{-2}$ at the step (c).

9. The method of manufacturing a microlens according to claim 1,
    wherein an ion is implanted from a surface of the resist to a portion having a depth of 0.1 μm or more at the step (c).

10. A method of manufacturing a solid-state image pick-up unit comprising the steps of:
    (e) adding an impurity to a semiconductor substrate, so as to form a photoelectric converting unit;
    (f) forming a light shielding film in a region including an upper part of the photoelectric converting unit;
    (g) applying a resist onto the light shielding film, and carrying out an exposure and a development to leave the resist in only a predetermined position, and forming an opening portion in an upper region of the photoelectric converting unit in the light shielding film by etching using the first resist as a mask;
    (h) forming a flat surface in a region including an upper part of the opening portion; and
    (i) forming a microlens on the flat surface provided above the opening portion,
    the step (i) including the steps of:
    (i-1) applying a resist for an excimer laser, an ultraviolet exposure or an electron beam onto the flat surface, and carrying out an exposure with a light in an ultraviolet region or an electron beam and a development, so as to form a patterned resist;
    (i-2) heat treating the patterned resist at the step (i-1), to give a shape of a microlens; and
    (i-3) implanting an ion in a plurality of directions into at least a surface portion of the resist to which the shape of the microlens is given at the step (i-2), to obtain a microlens having a heat resistance.

11. The method of manufacturing a solid-state image pick-up unit according to claim 10,
wherein the ion implantation in the directions at the step (i-3) is carried out by a dividing implantation or a rotating implantation.

12. The method of manufacturing a solid-state image pick-up unit according to claim 10,
wherein the exposure at the step (g) and the exposure at the step (i-1) are carried out by using an exposing device utilizing the same type of light source.

13. The method of manufacturing a solid-state image pick-up unit according to claim 10, further comprising
the step (i-4) of heat treating the microlens or irradiating the microlens with the light in the ultraviolet region after the step (i-3).

14. The method of manufacturing a solid-state image pick-up unit according to claim 10,
wherein the resist for the excimer laser, the ultraviolet exposure or the electron beam comprises a material selected from the group consisting of an acetal type, an SCAP type, polymethyl methacrylate (PMMA) and polyglycidyl methacrylate (PGMA).

15. The method of manufacturing a solid-state image pick-up unit according to claim 10,
wherein a plurality of unit resists are formed at the step (i-1) by carrying out patterning in such a manner that an interval between adjacent ones of said plurality of unit resists is equal to or smaller than 0.2 μm.

16. The method of manufacturing a solid-state image pick-up unit according to claim 10,
wherein a monovalent or polyvalent ion of B, P, Ar or As is implanted at the step (i-3).

17. The method of manufacturing a solid-state image pick-up unit according to claim 10,
wherein an ion is implanted at an acceleration energy of 40 to 200 keV at the step (i-3).

18. The method of manufacturing a solid-state image pick-up unit according to claim 10,
wherein an ion is implanted in a dose amount of $1\times10^{12}$ to $1\times10^{14}$ $cm^{-2}$ at the step (i-3).

19. The method of manufacturing a solid-state image pick-up unit according to claim 10,
wherein an ion is implanted from a surface of the resist to a portion having a depth of 0.1 μm or more at the step (i-3).

* * * * *